(12) United States Patent
Yang et al.

(10) Patent No.: US 11,923,457 B2
(45) Date of Patent: Mar. 5, 2024

(54) FINFET STRUCTURE WITH FIN TOP HARD MASK AND METHOD OF FORMING THE SAME

(71) Applicant: Taiwan Semiconductor Manufacturing Co., Ltd., Hsin-Chu (TW)

(72) Inventors: Che-Yu Yang, Hsinchu (TW); Kai-Chieh Yang, Kaohsiung (TW); Ching-Wei Tsai, Hsinchu (TW); Kuan-Lun Cheng, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/850,251

(22) Filed: Jun. 27, 2022

(65) Prior Publication Data

US 2022/0328691 A1 Oct. 13, 2022

Related U.S. Application Data

(62) Division of application No. 16/525,832, filed on Jul. 30, 2019, now Pat. No. 11,374,126.

(Continued)

(51) Int. Cl.
*H01L 29/78* (2006.01)
*H01L 29/51* (2006.01)
(Continued)

(52) U.S. Cl.
CPC .... *H01L 29/7851* (2013.01); *H01L 21/31116* (2013.01); *H01L 21/823431* (2013.01);
(Continued)

(58) Field of Classification Search
CPC ........... H01L 29/7851; H01L 21/31116; H01L 21/823431; H01L 27/0886; H01L 29/0847; H01L 29/518; H01L 29/66545; H01L 21/3081; H01L 29/165; H01L 29/7848; H01L 29/6656; H01L 29/41; H01L 29/4232; H01L 21/823821; H01L 21/845;
(Continued)

(56) References Cited

U.S. PATENT DOCUMENTS 8,455,313 B1 1/2013 Basker et al.
8,664,064 B2 3/2014 Kim et al.
(Continued)

*Primary Examiner* — Mohammad A Rahman
(74) *Attorney, Agent, or Firm* — HAYNES AND BOONE, LLP

(57) ABSTRACT

Semiconductor device and the manufacturing method thereof are disclosed herein. An exemplary semiconductor device comprises a semiconductor fin disposed over a substrate, wherein the semiconductor fin includes a channel region and a source/drain region; a gate structure disposed over the channel region of the semiconductor fin, wherein the gate structure includes a gate spacer and a gate stack; a source/drain structure disposed over the source/drain region of the semiconductor fin; and a fin top hard mask vertically interposed between the gate spacer and the semiconductor fin, wherein the fin top hard mask includes a dielectric layer, and wherein a sidewall of the fin top hard mask directly contacts the gate stack, and another sidewall of the fin top hard mask directly contacts the source/drain structure.

20 Claims, 14 Drawing Sheets

Related U.S. Application Data

(60) Provisional application No. 62/737,204, filed on Sep. 27, 2018.

(51) Int. Cl.
  *H01L 29/08* (2006.01)
  *H01L 21/311* (2006.01)
  *H01L 27/088* (2006.01)
  *H01L 21/8234* (2006.01)
  *H01L 29/66* (2006.01)

(52) U.S. Cl.
  CPC ...... *H01L 27/0886* (2013.01); *H01L 29/0847* (2013.01); *H01L 29/518* (2013.01); *H01L 29/66545* (2013.01); *H01L 29/66795* (2013.01)

(58) Field of Classification Search
  CPC ........... H01L 27/0924; H01L 27/10826; H01L 27/10879; H01L 27/1211; H01L 29/4179; H01L 29/66795–66818; H01L 29/785–7856; H01L 2029/7857–7858; H01L 2924/13067; H01L 29/36–365
  See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,935,195 B1 | 4/2018 | Xu et al. |
| 2014/0252474 A1 | 9/2014 | Song |
| 2015/0001468 A1 | 1/2015 | Huang et al. |
| 2017/0243760 A1 | 8/2017 | Chao et al. |
| 2019/0067449 A1* | 2/2019 | Zhou .................. H01L 29/0649 |
| 2020/0105938 A1 | 4/2020 | Yang et al. |

* cited by examiner

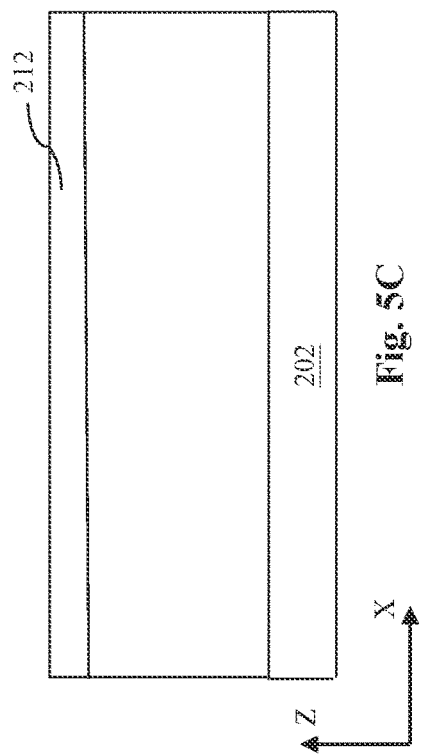
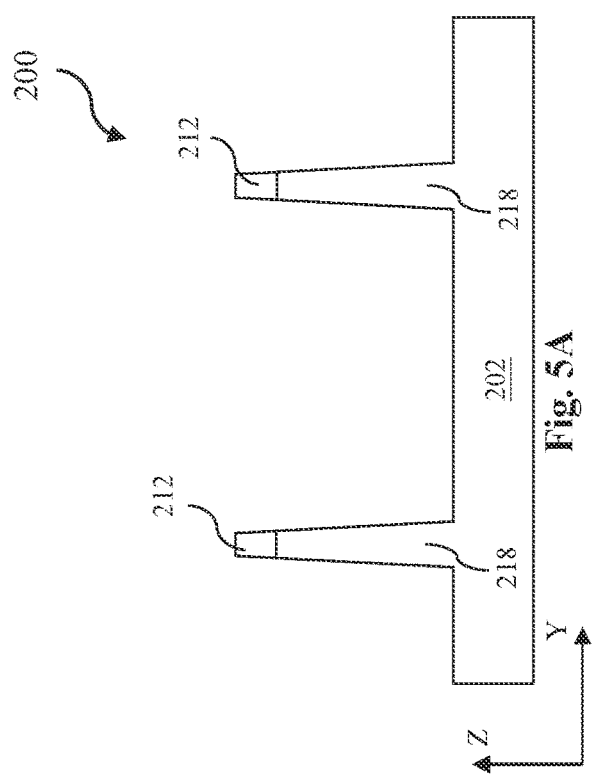
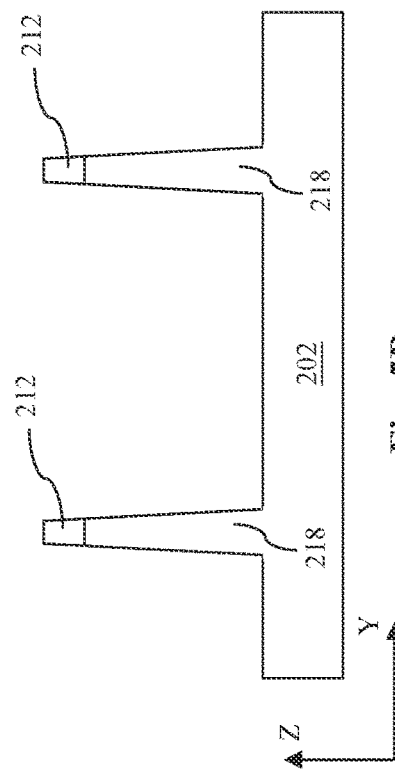

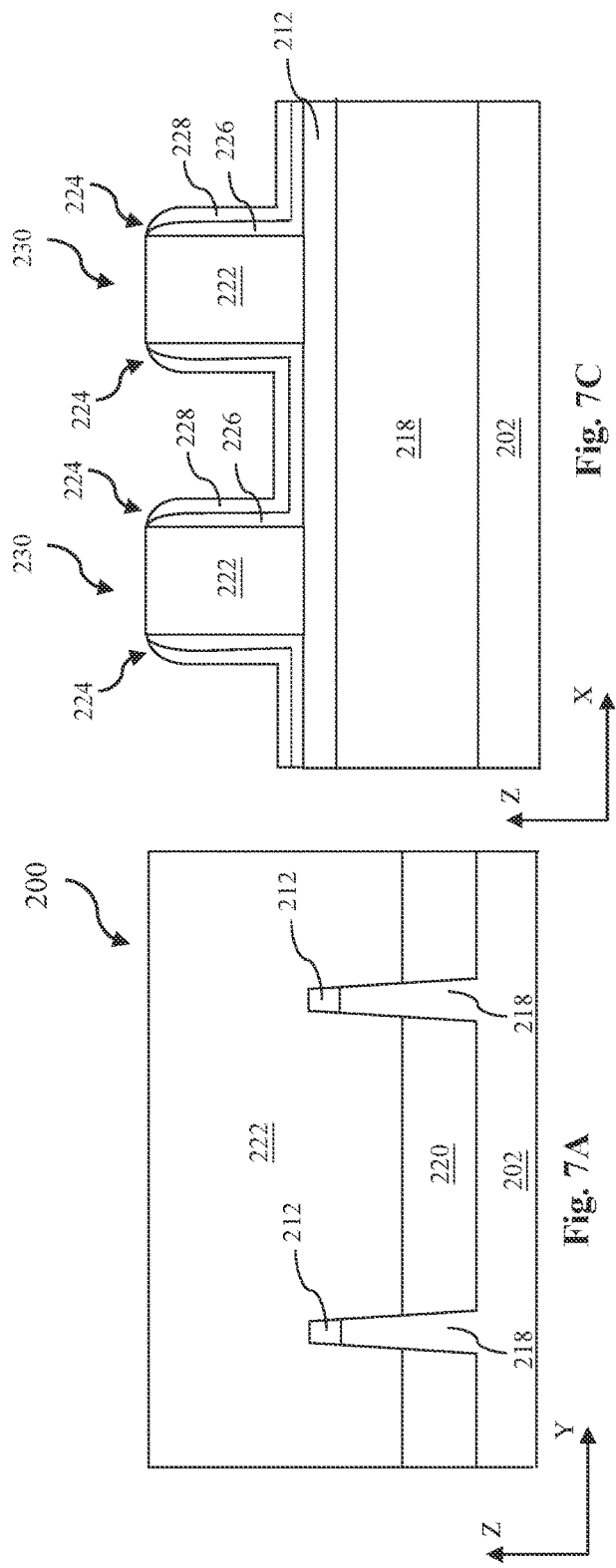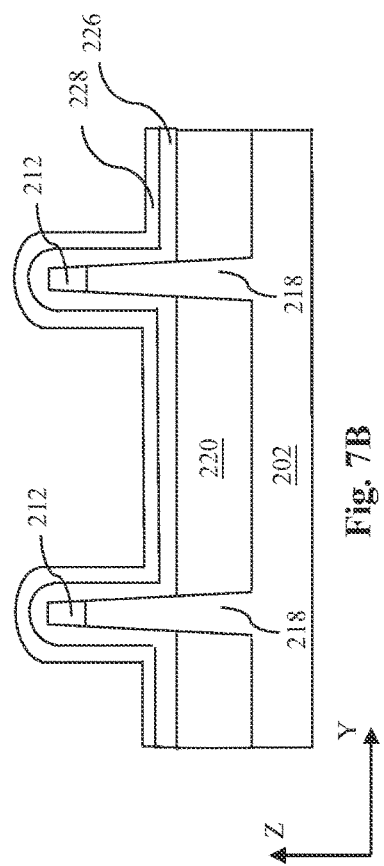

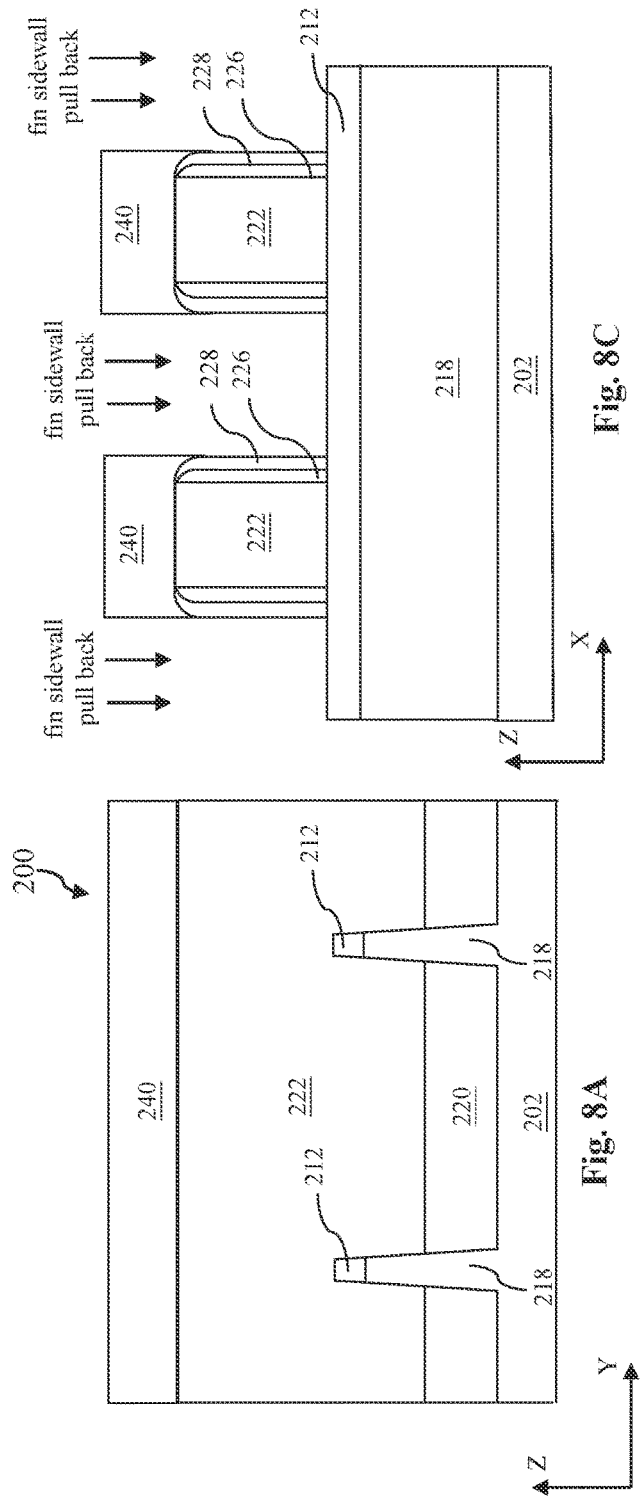

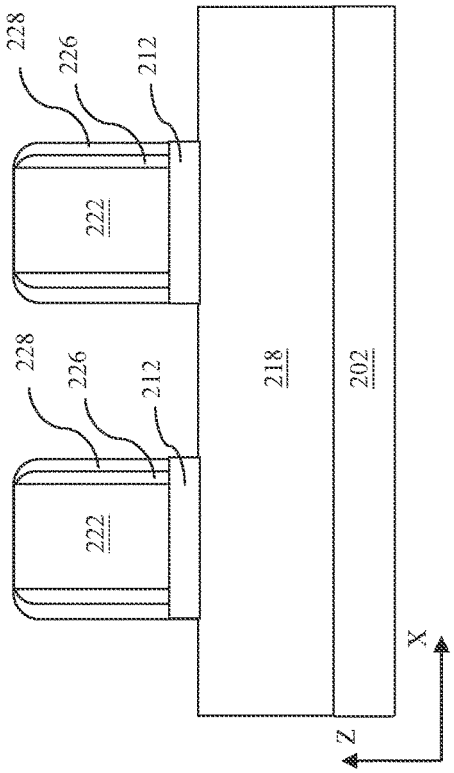
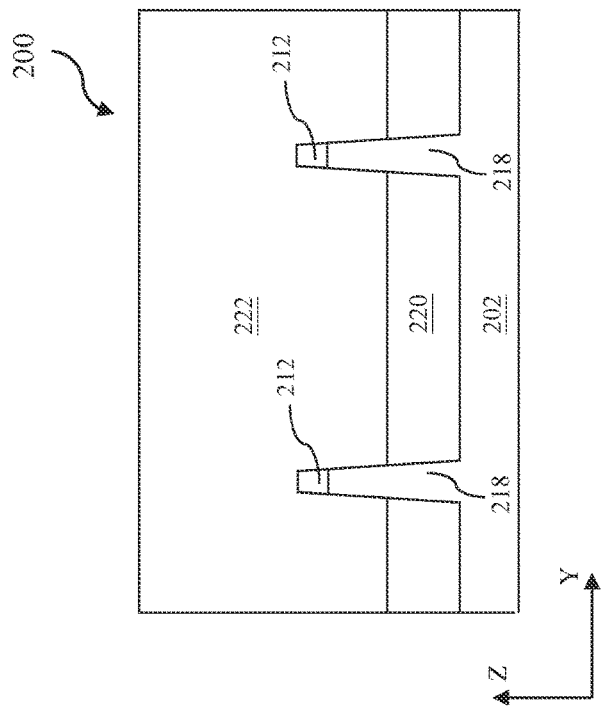
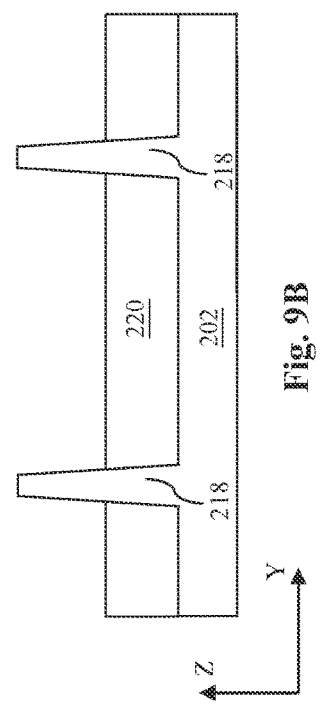
Fig. 9A
Fig. 9B
Fig. 9C

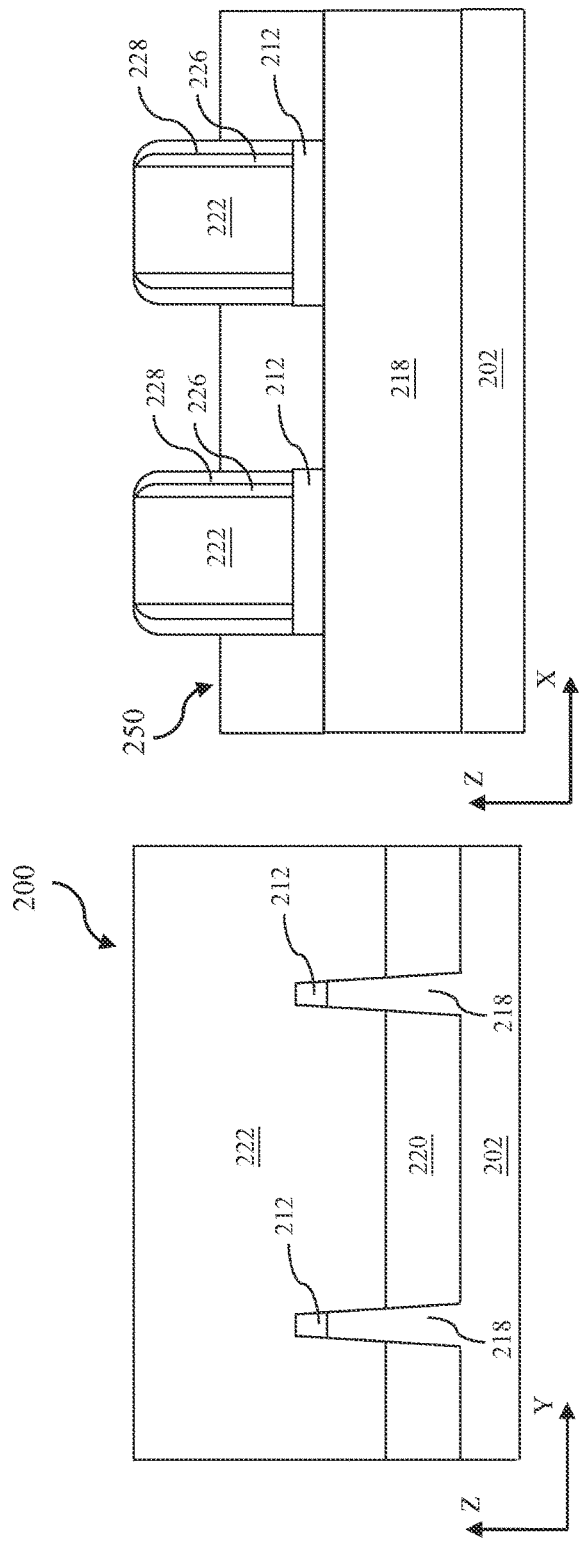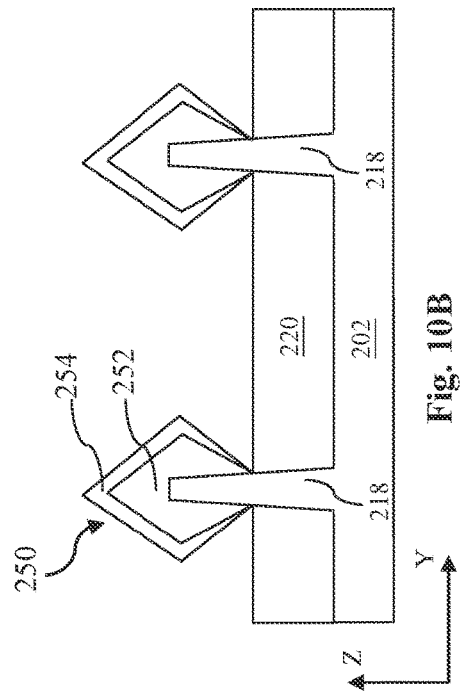
Fig. 10C
Fig. 10A
Fig. 10B

FINFET STRUCTURE WITH FIN TOP HARD MASK AND METHOD OF FORMING THE SAME

The present application is a divisional application of U.S. patent application Ser. No. 16/525,832, filed Jul. 30, 2019, which is a non-provisional application of and claims benefit of U.S. Provisional Patent Application Ser. No. 62/737,204, filed Sep. 27, 2018, each of which is incorporated herein by reference in its entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, in a fin-like field effect transistor (FinFET) fabrication process, it has been observed that fin top may be damaged during fin sidewall etch back process or dummy gate removing process. Accordingly, improvements are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 5A-14A illustrate cross-sectional views of the semiconductor device of FIG. 2 taken along line A-A' at intermediate stages of an embodiment of the method of FIG. 1 in accordance with some embodiments of the present disclosure;

FIGS. 5B-14B illustrate cross-sectional views of the semiconductor device of FIG. 2 taken along line B-B' at intermediate stages of an embodiment of the method of FIG. 1 in accordance with some embodiments of the present disclosure; and FIGS. 5C-14C illustrate cross-sectional views of the semiconductor device of FIG. 2 taken along line C-C' at intermediate stages of an embodiment of the method of FIG. 1 in accordance with some embodiments of the present disclosure.

DETAILED DESCRIPTION

Figure 1:
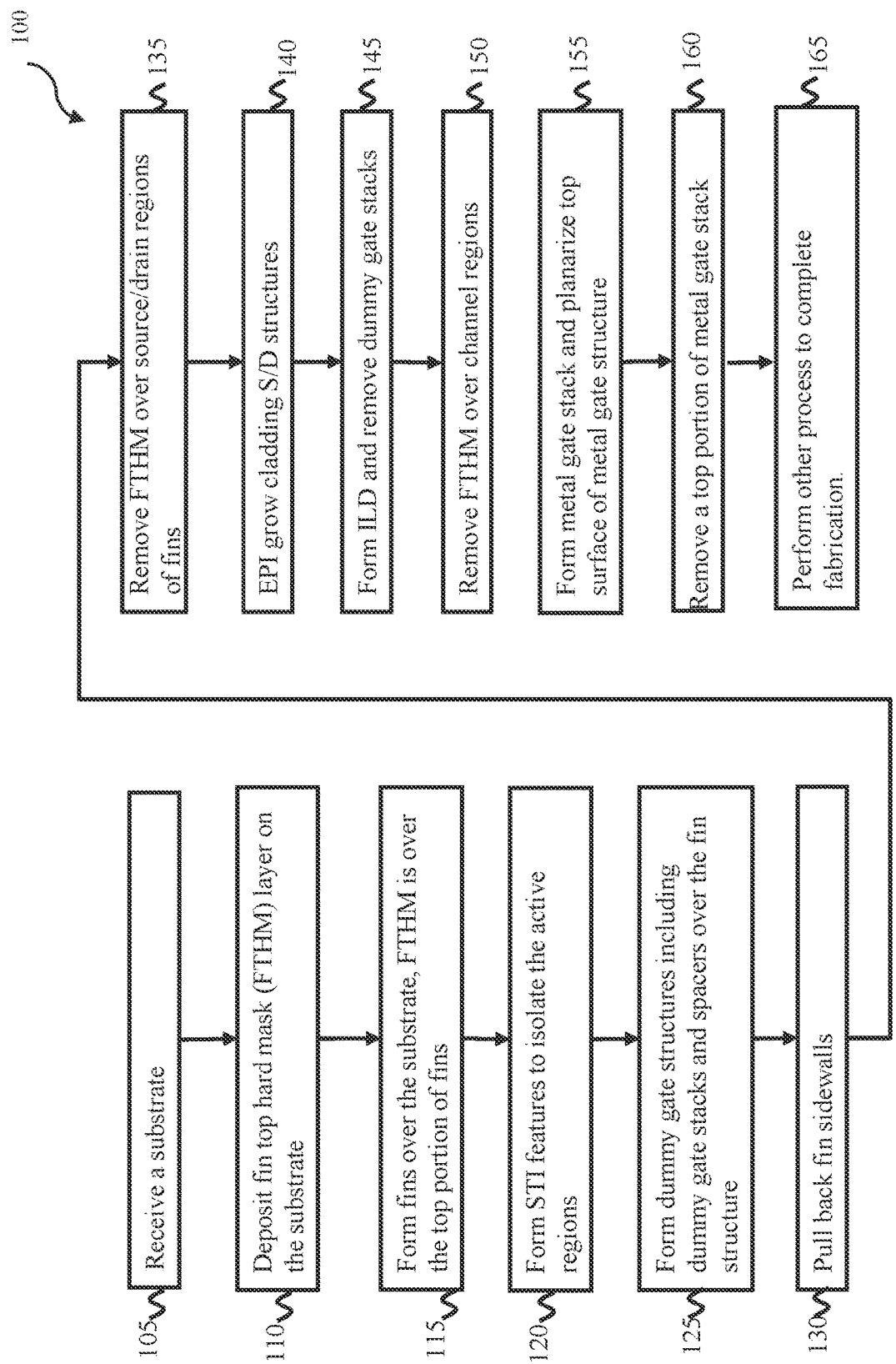
FIG. 1 illustrates a flowchart of an example method for making a semiconductor device in accordance with some embodiments of the present disclosure.

The present disclosure is directed to field-effect transistors (FETs), such as fin-like field effect transistors (FinFETs) and methods of fabricating the same. In particular, embodiments of the present disclosure provide FinFETs with reduced parasitic capacitance between source/drain (S/D) contacts and metal gates.

The following disclosure provides many different implementations, or examples, for implementing different features of the invention. Specific examples of components and arrangements are described below to simplify the present disclosure. These are, of course, merely examples and are not intended to be limiting. For example, the formation of a first feature over or on a second feature in the description that follows may include implementations in which the first and second features are formed in direct contact, and may also include implementations in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various implementations and/or configurations discussed. Moreover, the formation of a feature on, connected to, and/or coupled to another feature in the present disclosure that follows may include implementations in which the features are formed in direct contact, and may also include implementations in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

In many embodiments, methods of forming the FinFETs of the present disclosure avoid, reduce or minimize fin top loss during fin sidewall etch back process and/or dummy gate removing process by forming a hard mask over a top surface of the fin (the hard mask is thus referred to as a "fin top hard mask," or FTHM).

In some embodiments of the present disclosure, the FTHM over the top surface of the fin possesses higher etching selectivity with respect to the fin, thereby providing etching resistance during fin sidewall etch back or dummy gate removing processes. In some embodiments, the FTHM is formed in addition to an oxide and/or silicon nitride hard mask(s) generally formed over the fin. In some embodiments, the FTHM replaces these hard mask(s). In some embodiments, the FTHM includes a high-K dielectric material with high etching selectivity than the fin to protect the fin from loss or damage in the subsequent etching process.

In some embodiments, FTHM may also comprise amorphous silicon (a-Si) to prevent the fin form oxidation. In further embodiments, the FTHM may be configured to adjust stress experienced by various material layers formed over the fin.

The details of the embodiments of the present disclosure are described in the attached drawings.

Figure 2:
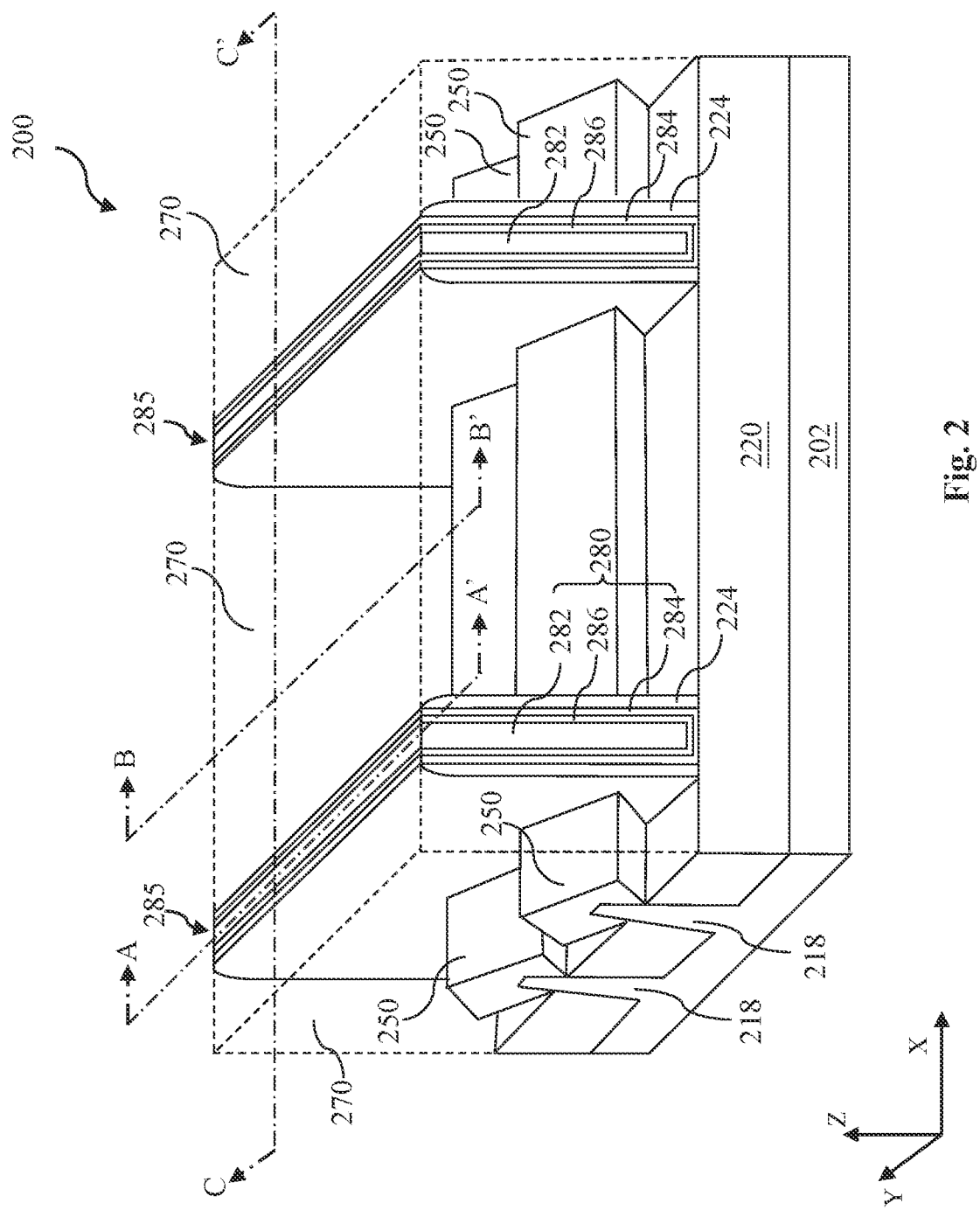
FIG. 2 illustrates a three-dimensional perspective view of an example semiconductor device in accordance with some embodiments of the present disclosure.
Figure 3:
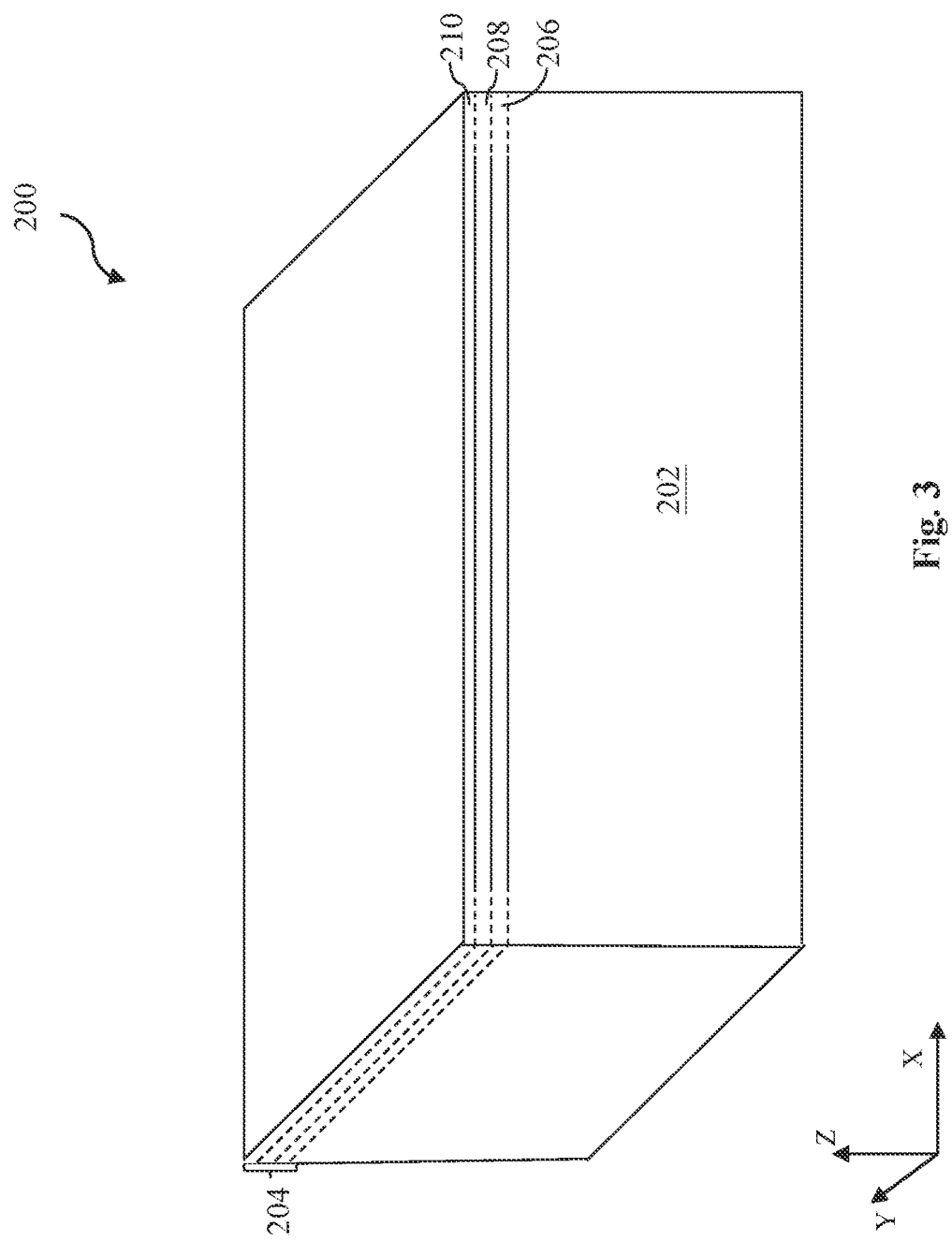
FIGS. 3 and 4 illustrate three-dimensional perspective views of the semiconductor device of FIG. 2 at intermediate stages of an embodiment of the method of FIG. 1 in accordance with some embodiments of the present disclosure.
Figure 4:
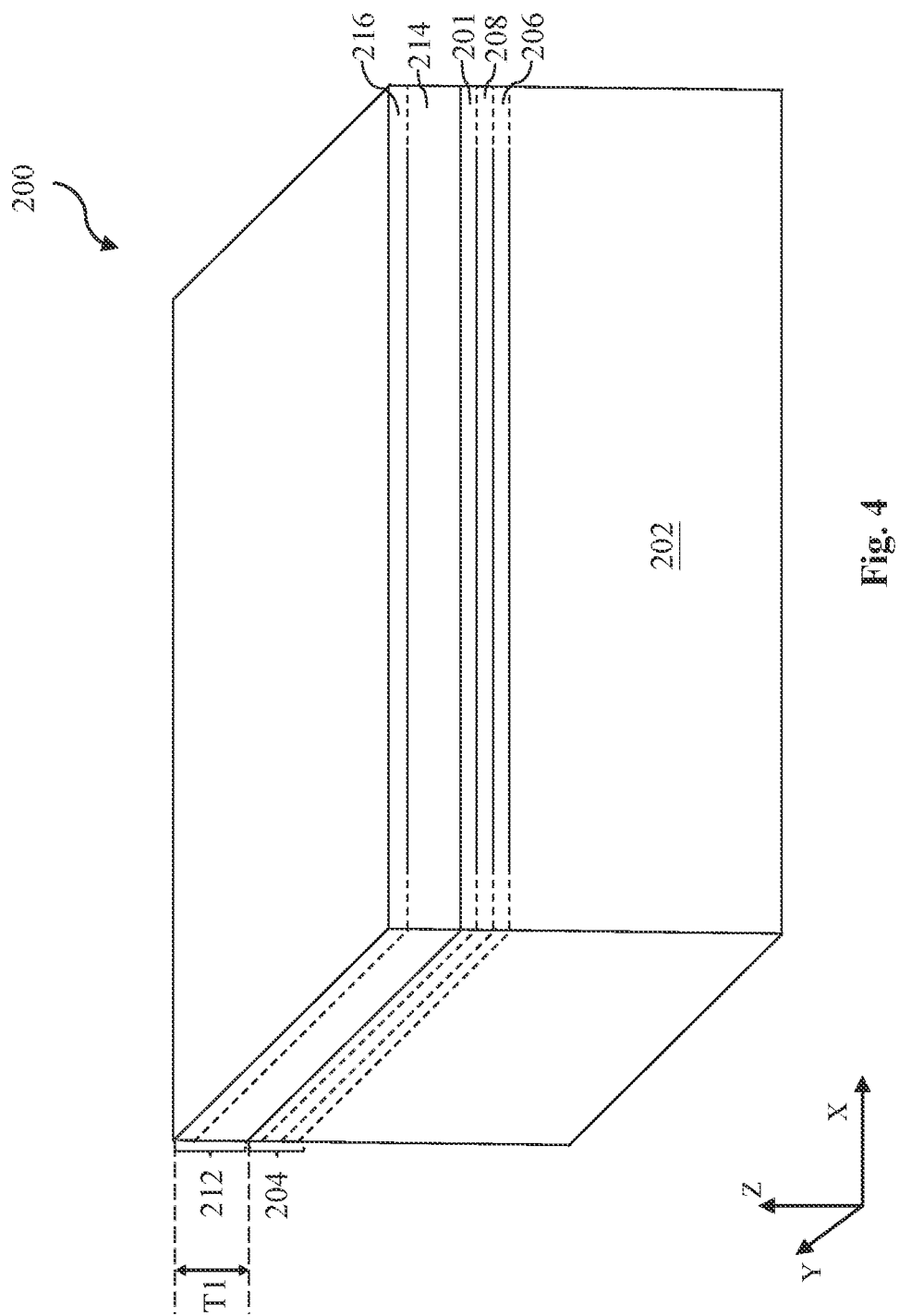

FIG. 1 illustrates a flow chart of a method 100 for forming a semiconductor device 200 (hereafter called "device 200" in short) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate various three-dimensional, planar top views, and cross-sectional views of device 200 during intermediate steps of method 100. In particular, FIG. 2 illustrates a three-dimensional view of device 200. FIGS. 3 and 4 illustrate three-dimensional perspective views of device 200 at intermediate stages of method 100 in accordance with some embodiments of the present disclosure. FIGS. 5A-14A illustrate cross-sectional views of device 200 of FIG. 2 taken along line A-A' (along a Y-direction) at intermediate stages of method 100 in accordance with some embodiments of the present disclosure. FIGS. 5B-14B illustrate cross-sectional views of device 200 of FIG. 2 taken along line B-B' (along a Y-direction) at intermediate stages of method 100 in accordance with some embodiments of the present disclosure. FIGS. 5C-14C illustrate cross-sectional views of device 200 of FIG. 2 taken along line C-C' (along an X-direction) at intermediate stages of method 100 in accordance with some embodiments of the present disclosure.

Device 200 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), fin-like FETs (FinFETs), gate-all-around FETs (GAA FETs), metal-oxide semiconductor field effect transistors (MOSFET), complementary metal-oxide semiconductor (CMOS) transistors, bipolar transistors, high voltage transistors, high frequency transistors, and/or other memory cells. Device 200 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an integrated circuit (IC). In some embodiments, device 200 may be a portion of an IC chip, a system on chip (SoC), or portion thereof. The present disclosure is not limited to any particular number of devices or device regions, or to any particular device configurations. For example, though device 200 as illustrated is a three-dimensional FET device (e.g., a FinFET), the present disclosure may also provide embodiments for fabricating planar FET devices.

Referring to FIG. 2, a semiconductor device 200 includes one or more fins 218 protruding from a substrate 202 and separated by an isolation structure 220, and one or more gate structures disposed over substrate 202 and fins 218. Gate structures 285 defines a channel region, a source region and a drain region of fins 218. Gate structures 285 may include gate stacks 280 (covering the channel region of fins 218) and gate spacers 224 disposed along sidewalls of gate stacks 280. Gate stacks 280 may include components such as one or more gate dielectric layers 284 disposed over isolation structure 220 and substrate 202, a barrier layers (not shown), a glue layer (not shown), a work function layer 286 disposed over gate dielectric layers 284, a metal fill layer 282 disposed over work function layer 286, other suitable layers, or combinations thereof. Various gate hard mask layers (not shown) may disposed over metal fill layer 282. Device 200 also include source/drain structures 250 epitaxially grown over S/D regions of fins 218. Device 200 may also comprise an interlayer dielectric (ILD) layer 270 (shown in dashed lines) deposited over substrate 202, isolation structure 220, fins 218, and source/drain structures 250. Forming of device 200 is discussed in method 100 of FIG. 1 along with different views of device 200 at intermediate stages of method 100 as illustrated in FIGS. 3, 4, 5A-5C to 13A-13C.

Referring to FIGS. 1 and 3, at operation 105, a substrate 202 is provided. In the depicted embodiment of FIG. 3, device 200 comprises a substrate (wafer) 202. In the depicted embodiment, substrate 202 is a bulk substrate that includes silicon. Alternatively or additionally, the bulk substrate includes another elementary semiconductor, such as germanium; a compound semiconductor, such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadmium sulfide, and/or cadmium telluride; an alloy semiconductor, such as SiGe, SiPC, GaAsP, AlInAs, AlGaAs, GaInAs, GaInP, and/or GaInAsP; other group III-V materials; other group II-IV materials; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 may include various doped regions. In some examples, substrate 202 includes n-type doped regions (for example, n-type wells) doped with n-type dopants, such as phosphorus (for example, $^{31}P$), arsenic, other n-type dopant, or combinations thereof. In the depicted embodiment, substrate 202 includes p-type doped region (for example, p-type wells) doped with p-type dopants, such as boron (for example, $^{11}B$, BF2), indium, other p-type dopant, or combinations thereof. In some embodiments, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

In some embodiments, substrate 202 may comprise a patterning layer 204 formed at a top portion of substrate 202. Patterning layer 204 includes a material that is different than a material of substrate 202 to achieve etching selectivity during subsequent etching processes. In the depicted embodiment, patterning layer 204 has a multilayer structure. For example, patterning layer 204 comprises a silicon oxide (SiO2) layer 206 formed over the top surface of substrate 202, an amorphous Silicon (a-Si) layer 208 deposited over the SiO2 layer 206, and a pad oxide layer 210 formed over the a-Si layer 208. In some embodiments, patterning layer 204 may include other layers such as silicon, nitrogen, carbon, other suitable patterning layer constituent, or combinations thereof. In some embodiments, patterning layer 204 may include a resist layer (also referred to as a photoresist layer) including a suitable resist material. Patterning layer 204 is formed by any suitable deposition process. For example, patterning layer 204 may be formed over substrate 202 by oxidation, thermal oxidation, chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable method, or combinations thereof.

Referring to FIGS. 1 and 4, at operation 110, a fin top hard mask (FTHM) 212 is formed over substrate 202. FTHM 212 includes a material having different etching selectivity than the material of substrate 202 (including the material of patterning layer 204) to protect the later formed fins 218 during subsequent etching processes, for example, fin sidewall pullback process and/or gate etching back process. In some embodiments, a material of FTHM 212 have a high dielectric constant (high-k) and lower ash damage, so that FTHM 212 may work as an etch stop layer to avoid or minimize the fin top loss/damage during the subsequent etching process. In the depicted embodiment, FTHM 212 comprises silicon carbon nitride (SiCN) to form a SiCN layer 214. In some embodiments, FTHM 212 includes silicon carbon oxynitride (SiCON). In some embodiments, a concentration of carbon (C) in the SiCN layer 214 is about 5% to about 20%, a concentration of nitride (N) in the SiCN layer 214 is about 40% to about 55%, and a dielectric constant of SiCN in layer 214 is about 8. Accordingly, SiCN layer 214 helps to protect the later formed fins 218 from loss/damage in the subsequent etching process. In some embodiments, FTHM 212 may also comprise an a-Si layer 216. A-Si layer 216 may serve as a prevention layer to prevent substrate 202 (including the later formed fins 218) from being oxidized. In the depicted embodiment of FIG. 3, FTHM 212 has a thickness T1 along a Z-direction. In some embodiments, the thickness T1 of FTHM 212 cannot be too thin to protect the fin from being damaged or too thick to prevent increasing the burden to remove it in the later processes. For example, the thickness T1 of FTHM 212 is about 3.5 nanometers (nm) to about 4 nm. FTHM 212 is formed by any suitable deposition process. For example, FTHM 212 may be formed over substrate 202 by ALD, CVD, plasma-enhanced chemical vapor deposition (PECVD), PVD, plating, other suitable method, or combinations thereof. A chemical mechanical planarization (CMP) process may be performed to planarize top surfaces of FTHM 212.

After formation of FTHM 212, an optional mask layer (not shown) may be formed over substrate 202 and FTHM 212. The mask layer may include a material that achieves desired etching selectivity (for example, between the mask layer and substrate 202), such as a dielectric material that includes silicon nitride, silicon oxide, or combinations thereof. The mask layer may be deposited by any suitable deposition process, for example, CVD, PVD, ALD, other suitable method, or combinations thereof. In some embodiments, FTHM 212 is served to replace the optional mask layer. In some embodiments, the optional mask layer is formed in addition to and over FTHM 212.

Referring to FIGS. 1 and 5A-5C, at operation 115, semiconductor fins 218 are formed in device 200. Each fin 218 may be suitable for providing an n-type FET or a p-type FET. In some embodiments, fins 218 as illustrated herein may be suitable for providing FETs of a similar type, i.e., both n-type or both p-type. Alternatively, they may be suitable for providing FETs of opposite types, i.e., an n-type and a p-type. Fins 218 are oriented substantially parallel to one another. Each of fins 218 has at least one channel region and at least one source region and drain region defined along their length in the x-direction, where the at least one channel region is covered by gate structures and is disposed between the source regions and the drain region.

In some embodiments, fins 218 are a portion of substrate 202 (such as a portion of a material layer of substrate 202). FTHM 212 are kept over the top portions of fins 218. For example, in the depicted embodiment, where substrate 202 includes silicon, fins 218 include silicon. FTHM 212 over the top portions of fins 218 includes SiCN, a-Si, or a combination thereof. Alternatively, in some embodiments, fins 218 are defined in a material layer, such as one or more semiconductor material layers, overlying substrate 202. For example, fins 218 can include a semiconductor layer stack having various semiconductor layers (such as a heterostructure) disposed over substrate 202. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on design of device 200.

Fins 218 are formed by any suitable process including various deposition, photolithography, and/or etching processes. An exemplary photolithography process includes forming a photoresist layer (resist) overlying substrate 202 (e.g., on a silicon layer), exposing the resist to a pattern, performing a post-exposure bake process, and developing the resist to form a masking element including the resist. The masking element is then used to etch the fin structure into substrate 202. Areas not protected by the masking element are etched using reactive ion etching (RIE) processes and/or other suitable processes. In some embodiments, as depicted in the present disclosure, fins 218 are formed by patterning and etching a portion of silicon substrate 202. In some other embodiments, fins 218 are formed by patterning and etching a silicon layer deposited overlying an insulator layer (for example, an upper silicon layer of a silicon-insulator-silicon stack of an SOI substrate). As an alternative to traditional photolithography, fins 218 can be formed by a double-patterning lithography (DPL) process. DPL is a method of constructing a pattern on a substrate by dividing the pattern into two interleaved patterns. DPL allows enhanced feature (e.g., fin) density. Various DPL methodologies include double exposure (e.g., using two mask sets), forming spacers adjacent features and removing the features to provide a pattern of spacers, resist freezing, and/or other suitable processes. It is understood that multiple parallel fins 218 may be formed in a similar manner.

Figure 6C:
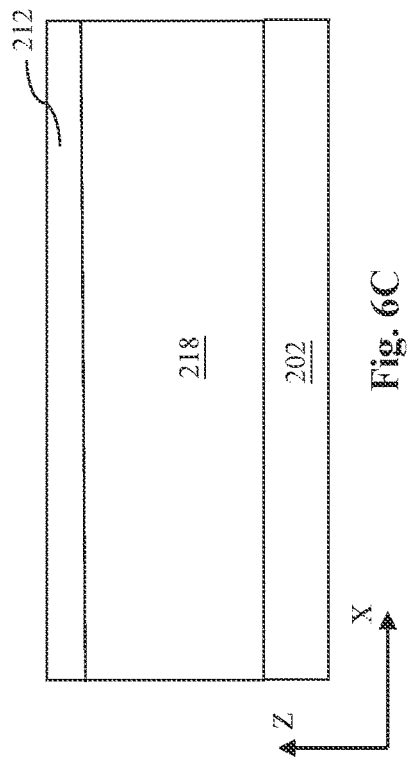
Figure 6A:
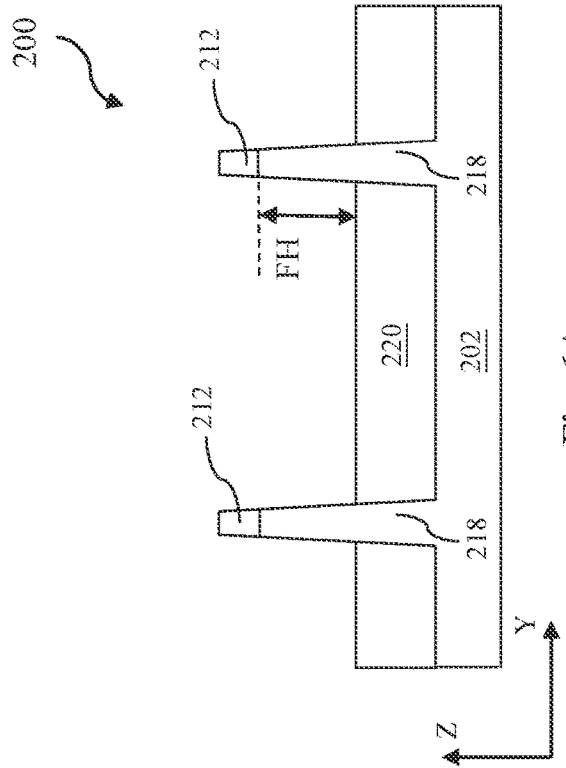
Figure 6B:
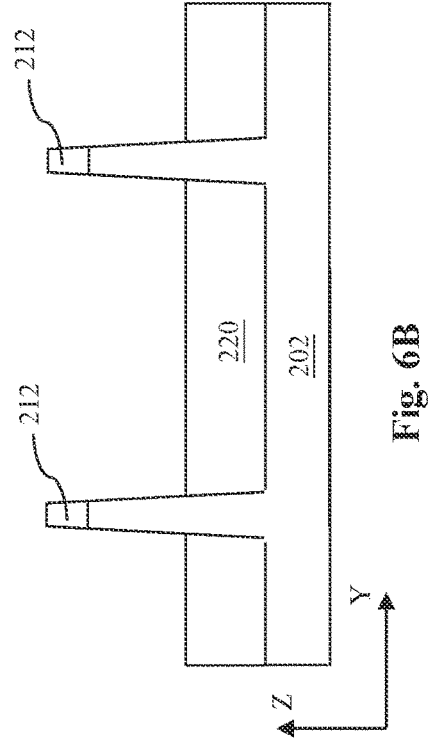

Referring to FIGS. 1 and 6A-6C, at operation 120, isolation structure 220 is formed over substrate 202. The lower portions of fins 218 are separated by isolation structure 220. Isolation structure 220 electrically isolates active device regions and/or passive device regions of device 200. Isolation structure 220 can be configured as different structures, such as a shallow trench isolation (STI) structure, a deep trench isolation (DTI) structure, a local oxidation of silicon (LOCOS) structure, or combinations thereof. Isolation structure 220 includes an isolation material, such as silicon oxide, silicon nitride, silicon oxynitride, other suitable isolation material (for example, including silicon, oxygen, nitrogen, carbon, and/or other suitable isolation constituent), or combinations thereof. In some embodiments, isolation structure 220 includes a multi-layer structure, such as a bulk dielectric layer disposed over a liner dielectric layer, where the bulk dielectric layer and the liner dielectric layer include materials depending on design requirements. In some embodiments, isolation structure 220 includes a dielectric layer disposed over a doped liner layer (including, for example, boron silicate glass (BSG) and/or phosphosilicate glass (PSG)). Isolation structure 220 is deposited by CVD, physical vapor deposition (PVD), atomic layer deposition (ALD), high density plasma CVD (HDPCVD), metal organic CVD (MOCVD), remote plasma CVD (RPCVD), PECVD, LPCVD, atomic layer CVD (ALCVD), atmospheric pressure CVD (APCVD), other suitable deposition process, or combinations thereof. A planarization process, such as a chemical mechanical polishing (CMP) process, can be performed on isolation structure 220. In the depicted embodiment, each fin 218 has a height FH in the z-direction. The fin height FH is a height between the top surface of STI structure 220 and the bottom surface of FTHM 212, as shown in FIG. 6A. In some embodiments, the height FH of each fin 218 is about 40 nm to about 70 nm. The thickness T1 of FTHM 212 cannot be too thin to protect the fin from being damaged or too thick to prevent increasing the burden to remove it in the later processes. In some embodiments, a ratio of the thickness T1 of FTHM 212 to the fin height FH is about 5% to about 10%. In some further embodiments, a ratio of the thickness T1 of FTHM 212 to the height of fin 218 FT is about 7%.

Referring to FIGS. 1 and 7A-7C, at operation 125, various dummy gate structures 230 are formed over fins 218. "Dummy gate structure" generally refers to an electrically non-functional gate structure of device 200. In some embodiments, a dummy gate structure mimics physical properties of an active gate structure, such as physical dimensions of the active gate structure, yet is inoperable (in other words, does not enable current to flow). Dummy gate structures 230 extend along y-direction and traverse respective fin 218. Dummy gate structures 230 engage the respective channel regions of fin 218, such that current can flow between the respective S/D regions of fin 218 during operation. Each dummy gate structure 230 may include a dummy gate stack 222 and spacers 224 deposited along sidewalls of dummy gate stack 222. In some embodiments, each dummy gate stack 222 includes, for example, an interfacial layer (including, for example, silicon oxide) and a dummy gate electrode (including, for example, polysilicon). In some embodiments, dummy gate stacks 222 may include a dummy gate dielectric disposed between the dummy gate electrode and the interfacial layer. The dummy gate dielectric includes a dielectric material, such as silicon oxide, a high-k dielectric material, other suitable dielectric material, or combinations thereof. Examples of high-k dielectric material include HfO2, HfSiO, HfSiON, HfTaO, HfTiO, HfZrO, zirconium oxide, aluminum oxide, hafnium dioxide-alumina (HfO2-Al2O3), other suitable high-k dielectric materials, or combinations thereof. High-k dielectric material generally refers to dielectric materials having a high dielectric constant, for example, greater than that of silicon oxide (k≈3.9). Dummy gate stacks 222 can include numerous other layers, for example, capping layers, interface layers, diffusion layers, barrier layers, hard mask layers, or combinations thereof. Dummy gate stacks 222 are formed by deposition processes, lithography processes, etching processes, other suitable processes, or combinations thereof.

For example, a deposition process is performed to form a dummy gate electrode layer over substrate 202, fins 218, and isolation structure 220. In some embodiments, a deposition process is performed to form a dummy gate dielectric layer before forming the dummy gate electrode layer, where the dummy gate electrode layer is formed over the dummy gate dielectric layer. The deposition process includes CVD, PVD, ALD, HDPCVD, MOCVD, RPCVD, PECVD, LPCVD, ALCVD, APCVD, plating, other suitable methods, or combinations thereof. A lithography patterning and etching process is then performed to pattern the dummy gate electrode layer (and, in some embodiments, the dummy gate dielectric layer) to form dummy gate stacks 222, such that dummy gate structures 230 wrap fins 218 as depicted. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposing process is assisted, implemented, or replaced by other methods, such as maskless lithography, electron-beam writing, or ion-beam writing. In yet another alternative, the lithography patterning process implements nanoimprint technology. The etching processes include dry etching processes, wet etching processes, other etching methods, or combinations thereof.

Each dummy gate structure 230 may include spacers 224 deposited along sidewalls of dummy gate stack 222. In some embodiments, spacers 224 comprise a single layer dielectric material. In some other embodiments, spacers 224 may comprise a multi-layer structure comprising different dielectric materials with different etching selectivity. In some embodiments, spacers 224 include more than one set of spacers, such as seal spacers, offset spacers, sacrificial spacers, dummy spacers, and/or main spacers, formed adjacent to dummy gate stacks 222. In such embodiments, the various sets of spacers can include materials having different etch rates. The dielectric material can include silicon, oxygen, carbon, nitrogen, other suitable material, or combinations thereof (for example, silicon oxide, silicon nitride, silicon oxynitride, silicon carbide, or silicon carbonitride). In the depicted embodiment, spacers 224 comprises a first spacer layer 226 comprising silicon carbon nitride (SiCN) and a second spacer layer 228 comprising silicon nitride (SiN). Although first spacer layer 226 and FTHM 212 may both comprise silicon, carbon, and nitride, the concentration of carbon (C) comprised in the semiconductor materials of first spacer layer 226 and FTHM 212 are different, such that not only first spacer layer 226 and second spacer layer 228 have different etching selectivity, but also first spacer layer 226 and FTHM 212 have different etching selectivity in the following etching processes. In some embodiments, a concentration of carbon (C) in the first spacer layer 226 is more than about 22%. Spacers 224 are formed by any suitable process. For example, in the depicted embodiment, a first spacer layer 226, such as a SiCN layer, may be deposited conformally over substrate 202, isolation structure 220, dummy gate stacks 222, fins 218 and FTHM 212. Subsequently, first spacer layer 226 is anisotropically etched to form first spacer set adjacent dummy gate stacks 222. A second spacer layer 228, such as a SiN layer, can be deposited conformally over first spacer layer 226, substrate 202, isolation structure 220, dummy gate stacks 222, fins 218 and FTHM 212. Subsequently, second spacer layer 228 is anisotropically etched to form second spacer set adjacent first spacer set. The first and second spacer sets along sidewalls of dummy gate stacks 222 together refer to spacers 224. First spacer layer 226 and second spacer layer 228 deposited conformally over the source/drain regions of fins 218 and FTHM 212 refer to fin sidewalls. In the depicted embodiment, top portion of fin sidewalls over source/drain regions of fins 218 and FTHM 212 may be kept during the anisotropically etching process to form spacers 224. Implantation, diffusion, and/or annealing processes may be performed to form lightly doped source and drain (LDD) features and/or heavily doped source and drain (HDD) features in source/drain regions of fins 218 before and/or after forming spacers 224.

Referring to FIGS. 1 and 8A-8C, at operation 130, fin sidewalls are pulled back until FTHM 212 are exposed. In order to limit the pullback process applied to only the fin sidewalls, not the spacers 224 along dummy gate stacks 222 and other devices on the substrate 202, including dummy gate stacks 222, dummy gate structures 230 including dummy gate stacks 222 and spacers 224 may be covered by a mask 240 prior to the pullback process. Mask 240 is patterned to expose only source/drain regions of fins 218 to pullback fin sidewalls. In some embodiments, mask 240 is a photoresist mask. In some further embodiments, mask 240 is a hard mask. Exemplary hard mask materials include an oxide material, such as silicon oxide; a nitrogen-containing material, such as silicon nitride or silicon oxynitride, an amorphous carbon material; silicon carbide; tetraethylorthosilicate (TEOS); other suitable materials; or combinations thereof. Patterning mask 240 may include exposing a mask layer to a pattern through a process such as photolithography, performing a post-exposure bake process, and developing the mask layer. Patterning may also be implemented or replaced by other proper methods, such as maskless photolithography, electron-beam writing, ion-beam writing, and molecular imprint.

Fin sidewalls are then pulled back through the final pattern of mask 240. Fin sidewalls pullback process may include one or more etching processes including wet etching, dry etching, reactive ion etching, and/or other suitable technique. In some embodiments, the etching process is a selective dry etching. The dry etching process may comprise an anisotropic etching, an isotropic etching, or combinations thereof. The etching process may be stopped until FTHM 212 over source/drain regions of fins 218 are exposed. Since FTHM 212 comprises a semiconductor material (for example, SiCN) having different etching selectivity than the semiconductor material of fin sidewalls (including first spacer layer 226 (for example, SiCN, but with different concentration of carbon than FTHM 212) and second spacer layer 228 (for example, SiN)), the etching process only pulls back fin sidewalls while leave FTHM 212 and fins 218 substantially unaffected. As shown in the depicted embodiment of FIG. 7B, the pullback process selectively etches spacers 224 (including second spacer layer 228 and first spacer layer 226) in the source/drain regions of fins 218. In some embodiments, spacers 224 are completely removed. In some other embodiments, a thin portion of the first spacer layer 226 over isolation structure 220 may be remained. FTHM 212 are not substantially affected by the fin sidewalls pullback process. Thereby, fins 218 are protected by FTHM 212 during fin sidewalls pullback process and fin top loss can be avoided during fin sidewalls pullback process.

Referring to FIGS. 1 and 9A-9C, at operation 135, FTHM 212 over source/drain regions of fins 218 is removed to expose source/drain regions of fins 218. The removing process may include dry etching process, wet etching process, and/or combinations thereof. The removing process may include a selective etching process. Since FTHM 212 and fins 218 have different materials with different etching selectivity (different carbon and/or nitrogen composition), only FTHM 212 over source/drain regions of fins 218 is removed by operation 135. Fins 218 are not substantially affected after removing of FTHM 212 over the source/drain regions. The selective etching processes have etching parameters that can be tuned, such as etchants used, etching temperature, etching solution concentration, etching pressure, source power, RF bias voltage, RF bias power, etchant flow rate, and other suitable parameters. For example, a dry etching process may include reactive ion etching (RIE). In the depicted embodiment, the thin portion of first spacer layer 226 remained over isolation structure 220 after fin sidewalls pullback process may also be removed when removing FTHM 212 over the source/drain regions of fins 218. After removing FTHM 212, source/drain regions of fins 218 are exposed as shown in FIG. 9B.

Referring to FIGS. 1 and 10A-10C, at operation 140, source/drain structures 250 are epitaxially grown in the source/drain region of fins 218. In some embodiments, each source/drain (S/D) structure 250 is a cladding S/D feature and may comprise an epitaxial (EPI) S/D feature 252 and a silicide layer 254. For example, semiconductor material is epitaxially grown on fins 218, forming EPI S/D features 252. In some embodiments, a fin recess process (for example, an etch back process) is performed on source/drain regions of fins 218, such that EPI S/D features 252 are grown from lower fin active regions. In some other embodiments, source/drain regions of fins 218 are not subjected to a fin recess process, such that EPI S/D features 252 are grown from and wrap at least a portion of upper fin active regions. Subsequently, a silicide layer 254 may be deposited around EPI S/D feature 252 to form cladding source/drain structure 250. In some embodiments, epitaxial source/drain structures 250 extend (grow) laterally along the y-direction (substantially perpendicular to fins 218), such that source/drain structures 250 are merged source/drain structures that span more than one fin. In some embodiments, source/drain structures 250 include partially merged portions (with interruption (or gaps) between epitaxial material grown from adjacent fins) and/or fully merged portions (without interruption (or gaps) between epitaxial material grown from adjacent fins).

In various embodiments, EPI S/D features 252 may include Ge, Si, GaAs, AlGaAs, SiGe, GaAsP, SiP, or other suitable material. In some embodiments, EPI S/D features 252 are doped with n-type dopants and/or p-type dopants. For example, in a p-type FinFET region, EPI S/D features 252 may include epitaxial layers including silicon and/or germanium, where the silicon germanium containing epitaxial layers are doped with boron, carbon, other p-type dopant, or combinations thereof (for example, forming an Si:Ge:B epitaxial layer or an Si:Ge:C epitaxial layer). In furtherance of the example, in a n-type FinFET region, EPI S/D features 252 can include epitaxial layers including silicon and/or carbon, where silicon-containing epitaxial layers or silicon-carbon-containing epitaxial layers are doped with phosphorous, arsenic, other n-type dopant, or combinations thereof (for example, forming an Si:P epitaxial layer, an Si:C epitaxial layer, or an Si:C:P epitaxial layer). In some embodiments, EPI S/D features 252 include materials and/or dopants that achieve desired tensile stress and/or compressive stress in the channel regions.

An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of fins 218. EPI S/D features 252 may be doped with n-type dopants and/or p-type dopants. In some embodiments, EPI S/D features 252 are doped during deposition by adding impurities to a source material of the epitaxy process. In some embodiments, EPI S/D features 252 are doped by an ion implantation process subsequent to a deposition process. In some embodiments, annealing processes are performed to activate dopants in EPI S/D features 252 and/or other source/drain features of device 200, such as HDD regions and/or LDD regions.

In some embodiments, silicide layers 254 are formed by depositing a metal layer over EPI S/D features 252. The metal layer includes any material suitable for promoting silicide formation, such as nickel, platinum, palladium, vanadium, titanium, cobalt, tantalum, ytterbium, zirconium, other suitable metal, or combinations thereof. Device 200 is then heated (for example, subjected to an annealing process) to cause constituents of EPI S/D features 252 (for example, silicon and/or germanium) to react with the metal. Silicide layers 254 thus include metal and a constituent of EPI S/D features 252 (for example, silicon and/or germanium). In some embodiments, silicide layers 254 include nickel silicide, titanium silicide, or cobalt silicide. Any un-reacted metal, such as remaining portions of the metal layer, is selectively removed by any suitable process, such as an etching process.

Silicide layers 254 and EPI S/D features 252 together form cladding source/drain structures 250. Fins 218 in the source/drain regions are protected by cladding source/drain structures 250. Fins 218 in the channel regions are protected by FTHM 212. Therefore, fin top loss can be avoided in the following etching processes. Also, source/drain contact resistance can be reduced by cladding source/drain structures 250 due to the increasing contact area between silicide layers 254 and EPI S/D features 252.

Referring to FIGS. 1 and 11A-11C, at operation 145, a metal gate replacement process is performed. First, an interlayer dielectric (ILD) layer 270 (shown in dashed lines) is formed over substrate 202, particularly over source/drain structures 250, dummy gate structures 230, and fins 218. In some embodiments, ILD layer 270 is a portion of a multilayer interconnect (MLI) feature that electrically couples various devices (for example, transistors, resistors, capacitors, and/or inductors) and/or components (for example, gate structures and/or source/drain features) of device 200, such that the various devices and/or components can operate as specified by design of device 200. ILD layer 270 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In some embodiments, ILD layer 270 has a multilayer structure having multiple dielectric materials. In some embodiments, a contact etch stop layer (CESL) is disposed between ILD layer 270 and source/drain structures 250, dummy gate structures 230, and/or fins 218. The CESL includes a material different than ILD layer 270, such as a dielectric material that is different than the dielectric material of ILD layer 270. In the depicted embodiment, where ILD layer 270 includes a low-k dielectric material, the CESL includes silicon and nitrogen (for example, silicon nitride or silicon oxynitride). ILD layer 270 and/or the CESL are formed over substrate 202, for example, by a deposition process (such as CVD, FCVD, PVD, ALD, HDPCVD, MOCVD, RPCVD, PECVD, LPCVD, ALCVD, APCVD, plating, other suitable methods, or combinations thereof). Subsequent to the deposition of ILD layer 270 and/or the CESL, a CMP process and/or other planarization process is performed until reaching (exposing) top surfaces of dummy gate structures 230.

Figure 11C:
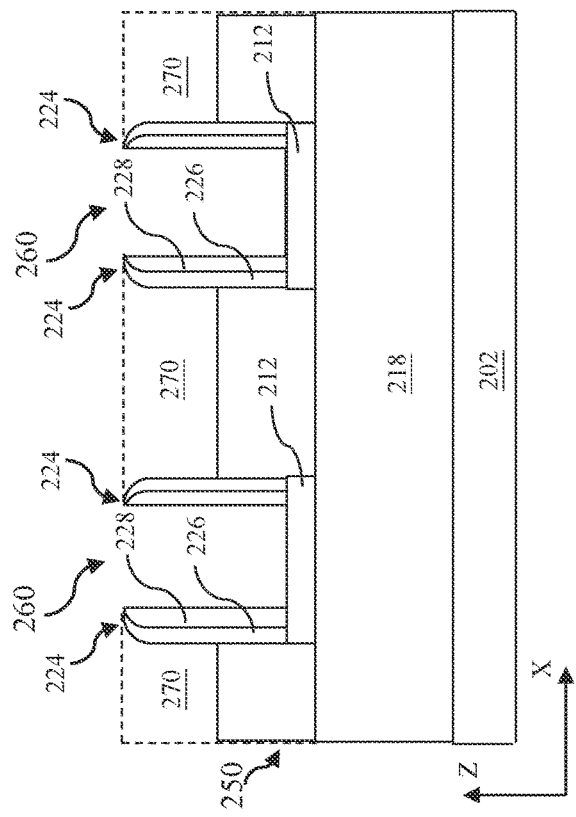
Figure 11A:
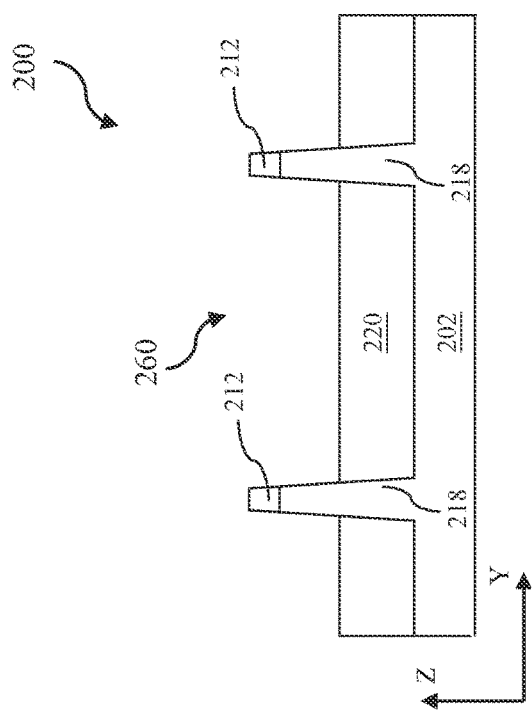
Figure 11B:
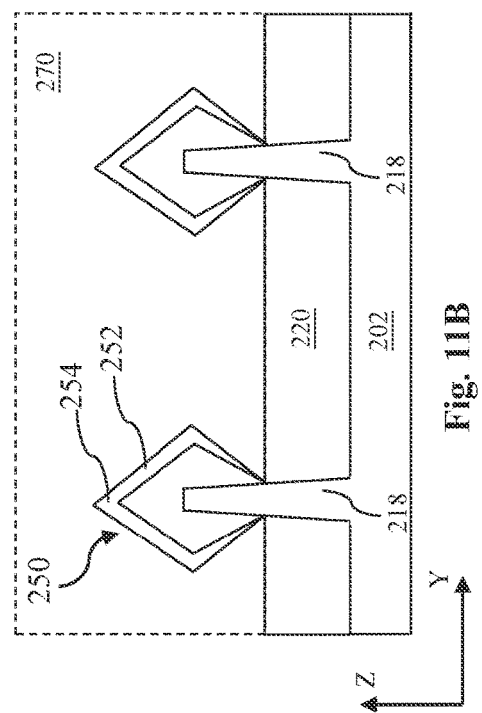

Still at operation 145, dummy gate stacks 222 of dummy gate structures 230 are removed to form gate trenches (gate openings) 260. Gate trenches 260 expose upper fin active regions. For example, removing dummy gate stacks 222 of dummy gate structures 230 exposes channel regions of fins 218, as shown in FIGS. 11A and 11C. In the depicted embodiment, removing of dummy gate stacks 222 exposes FTHM 212 over the channel regions of fins 218. Thus, fins 218 are protected by FTHM 212 and fin top loss/damage can be avoided or minimized during the removing process of dummy gate stacks 222, as shown in FIG. 11C. The removing process may be an etching process, which may include a dry etching process, a wet etching process, or combinations thereof. In some embodiments, an etching process selectively removes dummy gate stacks 222 without (or minimally) removing ILD layer 270, gate spacers 224, isolation structure 220, and/or other features of device 200. In some embodiments, dummy gate stacks 222 of at least one of dummy gate structures 230 is replaced with a metal gate, while dummy gate stacks 222 of at least one of dummy gate structures 230 remains (in other words, is not replaced), such that a trench may not be formed in all of dummy gate structures 230.

Figure 12C:
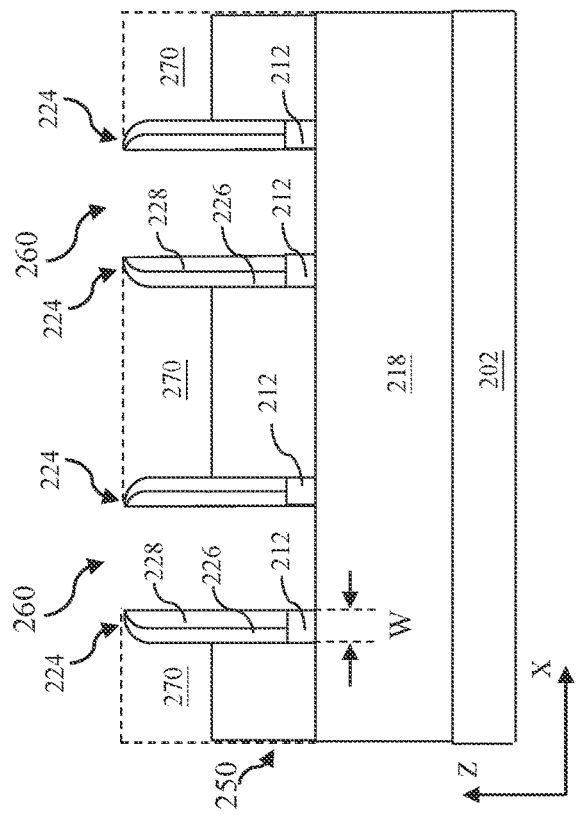
Figure 12A:
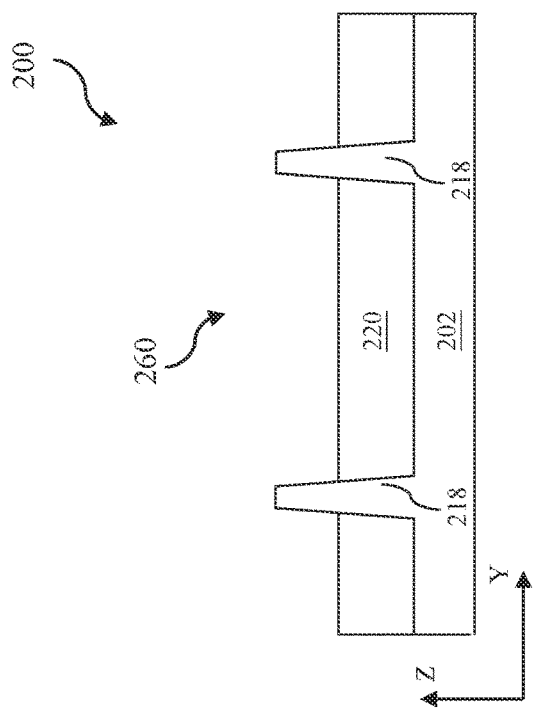
Figure 12B:
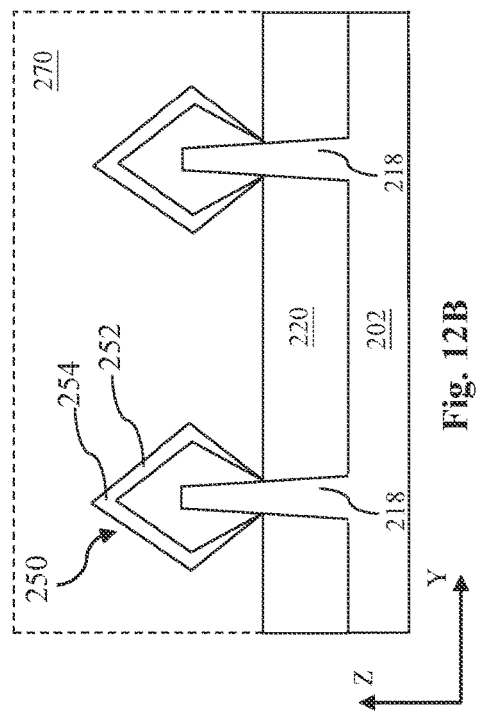

Referring to FIGS. 1 and 12A-12C, at operation 150, portions of FTHM 212 exposed in gate trenches 260 are removed such that top surfaces of the channel regions of fins 218 are exposed in gate trenches 260. The removing process may include dry etching process, wet etching process, and/or combinations thereof. Since FTHM 212 and fins 218 have different materials with different etching selectivity (different carbon and/or nitrogen composition), the removing process may be a selective etching process such that only portions of FTHM 212 over the channel regions of fins 218 (exposed in gate trenches 260) are removed. Spacers 224 (including layers 226 and 228) may be used as etching masks when performs the etching process. Fins 218 are not substantially affected after removing of FTHM 212. In some embodiments, a selective etching process may include reactive ion etching (RIE). In the depicted embodiment, only portions of FTHM 212 below spacers 224 are remained after operation 150. A top surface of each FTHM 212 directly contacts a bottom surface of spacer 224 and a bottom surface of each FTHM 212 directly contacts a portion of a top surface of fin 218. A sidewall of each FTHM 212 being apart from the gate trench 260 directly contacts source/drain structure 250, and the opposite sidewall of each FTHM 212 is exposed in gate trenches 260. In other words, spacers 224 are not extended under source/drain structures 250 and gate stacks 280. Sidewalls of spacers 224 and FTHM 212 and top surface of channel regions of fins 218 defines gate trench 260. As depicted in FIG. 12C, a width W of fin top hard mask 212 in the x-direction is substantially equal to a width of spacer 224.

Referring to FIGS. 1 and 13A-13C, at operation 155, metal gate stacks 280 are formed in gate trenches 260. Metal gate stacks 280 and gate spacers 224 together form metal gate structures 285. Metal gate stacks 280 are formed in gate trenches 260 by a proper procedure, such as a gate-last process or a high-k-last process. Metal gate stacks 280 are formed on substrate 202 overlying channel regions of fins 218. Metal gate stacks 280 may include a gate dielectric layer 284, a work function layer 286 disposed over gate dielectric layer 284, and a metal fill layer 282 disposed on work function layer 286.

Figure 13C:
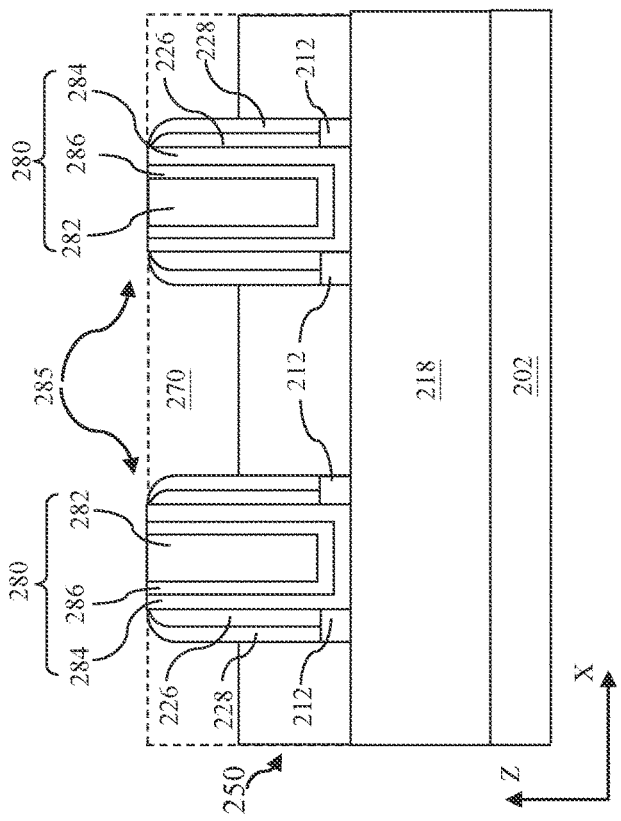
Figure 13A:
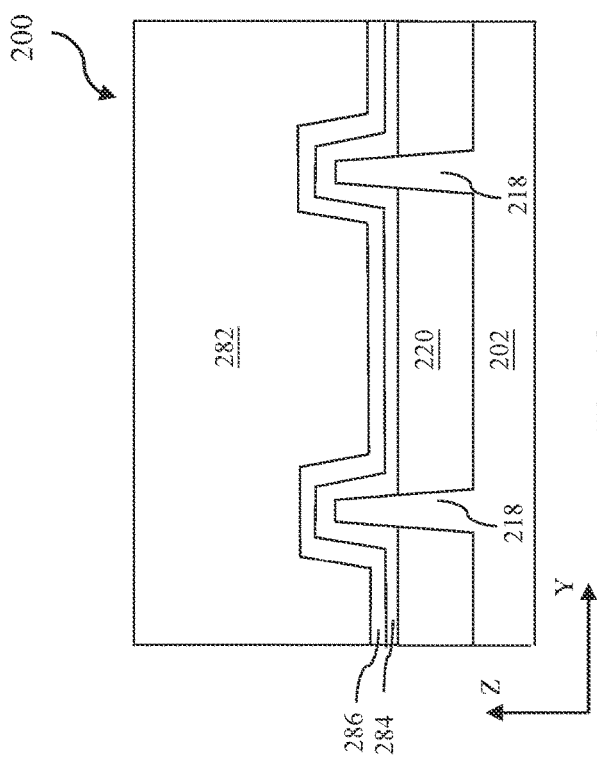
Figure 13B:
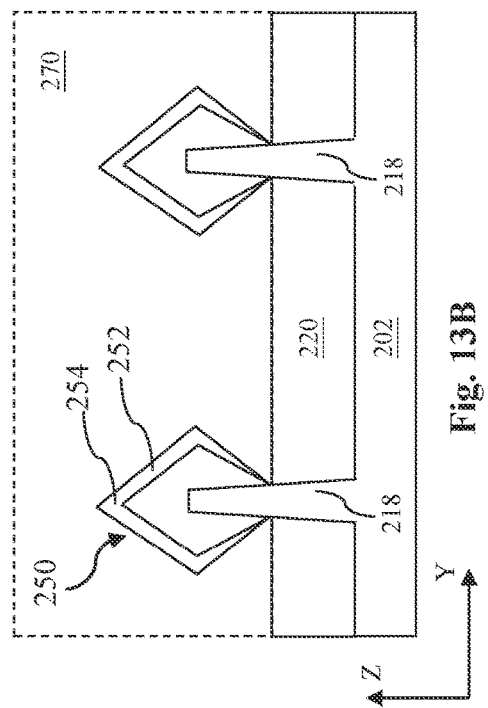
Figure 14C:
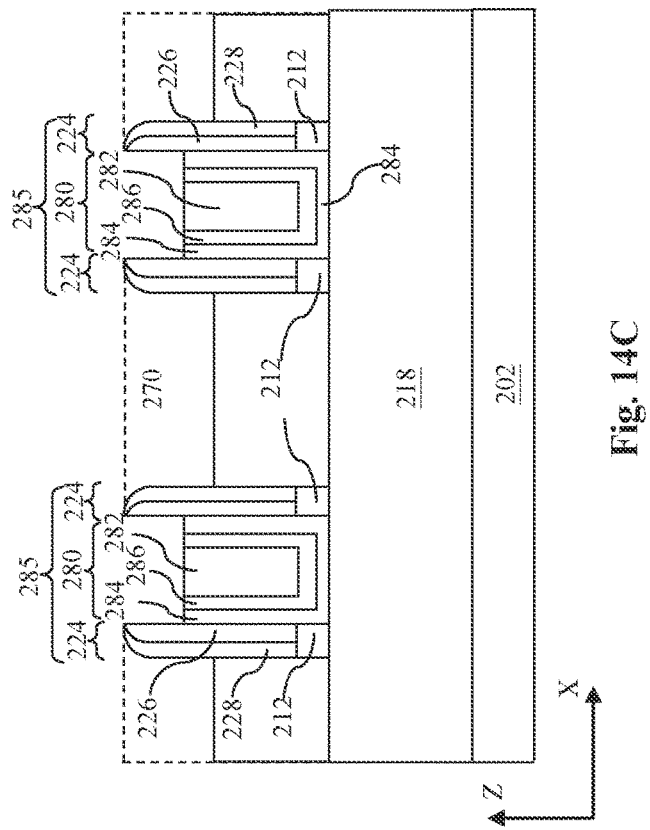
Figure 14A:
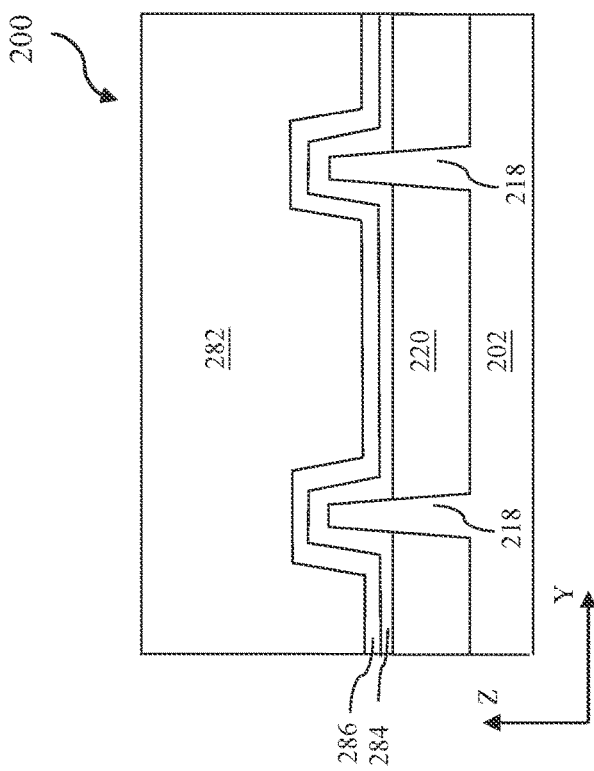
Figure 14B:
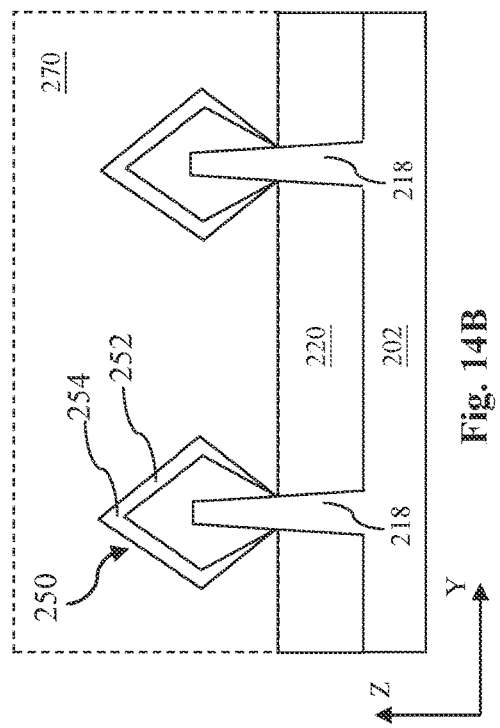

Referring to FIG. 13A, gate dielectric layer 284 is conformally deposited over fins 218 and isolation structure 220, such that gate dielectric layer 284 has substantially uniform thicknesses. In some embodiments, a thickness of gate dielectric layer 284 is about 1.5 nm to about 2 nm. Gate dielectric layer 284 includes a dielectric material, such as silicon oxide, high-k dielectric material, other suitable dielectric material, or combinations thereof. In the depicted embodiment, gate dielectric layer 284 includes one or more high-k dielectric layers including, for example, hafnium, aluminum, zirconium, lanthanum, tantalum, titanium, yttrium, oxygen, nitrogen, other suitable constituent, or combinations thereof. In some embodiments, the one or more high-k dielectric layers include $HfO_2$, HfTiO, HfTiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. In some embodiments, the high-k dielectric material has a dielectric constant greater than or equal to about five (k≥5). In some embodiments, gate dielectric layer 284 further includes an interfacial layer (including a dielectric material, such as silicon oxide) disposed between the high-k dielectric layer 284 and fins 218 and/or isolation structure 220. In some embodiments, gate dielectric layer 284 includes a nitrogen-doped oxygen-containing dielectric layer and a high-k dielectric layer disposed over the nitrogen-doped oxygen-containing dielectric layer. Gate dielectric layer 284 is formed by various processes, such as ALD, CVD, PVD, and/or other suitable process, such as described herein.

Still referring to FIG. 13A, a work function layer 286 is conformally deposited over gate dielectric layer 284. Work function layer 286 includes a conductive layer of metal or metal alloy with proper work function such that the corresponding FET is enhanced for its device performance. Work function layer 286 is different in composition for a p-FET and an n-FET, respectively referred to as an p-type work function (WF) metal and an n-type WF metal. Particularly, an n-type WF metal is a metal having a first work function such that the threshold voltage of the associated n-FET is reduced. The n-type WF metal is close to the silicon conduction band energy (Ec) or lower work function, presenting easier electron escape. For example, the n-type WF metal has a work function of about 4.2 eV or less. A p-type WF metal is a metal having a second work function such that the threshold voltage of the associated p-FET is reduced. The p-type WF metal is close to the silicon valence band energy (Ev) or higher work function, presenting strong electron bonding energy to the nuclei. For example, the p-type work function metal has a WF of about 5.2 eV or higher. In some embodiments, the n-type WF metal includes tantalum (Ta). In other embodiments, the n-type WF metal includes titanium aluminum (TiAl), titanium aluminum nitride (TiAlN), or combinations thereof. In some other embodiments, the n-metal include Ta, TiAl, TiAlN, tungsten nitride (WN), or combinations thereof. In some embodiments, the p-type WF metal includes titanium nitride (TiN) or tantalum nitride (TaN). In other embodiments, the p-metal include TiN, TaN, tungsten nitride (WN), titanium aluminum (TiAl), or combinations thereof. The n-type WF metal or the p-type WF metal may include various metal-based films as a stack for optimized device performance and processing compatibility. The work function metal is conformally deposited by a suitable process, such as ALD, CVD, PVD, and/or other suitable process, over gate dielectric layer 284, such that work function layer 286 has substantially uniform thicknesses. In some embodiments, a thickness of work function layer 286 is about 1.5 nm to about 3 nm.

Furthermore, metal gate stacks 280 also include a metal fill layer 282 disposed over work function layer 286. In various embodiments, metal fill layer 282 includes aluminum, tungsten, copper or other suitable metal. Metal fill layer 282 is deposited by a suitable technique, such as PVD or plating.

Metal gate stacks 280 may also include other layers, such as a capping layer, a glue/barrier layer, and a hard mask layer. A capping layer can include a material that prevents or eliminates diffusion and/or reaction of constituents between gate dielectric layer 284 and other layers of metal gate stacks 280 (in particular, gate layers including metal). In some embodiments, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A glue/barrier layer can include a material that promotes adhesion between adjacent layers, such as work function layer 286 and metal fill layer 282, and/or a material that blocks and/or reduces diffusion between gate layers, such as work function layer 286 and metal fill layer 282. For example, the glue/barrier layer includes metal (for example, W, Al, Ta, Ti, Ni, Cu, Co, other suitable metal, or combinations thereof), metal oxides, metal nitrides (for example, TiN), or combinations thereof. In some embodiments, a hard mask layer (including, for example, silicon nitride or silicon carbide) is disposed over at least a portion of metal gate stacks 280. Metal gate stacks 280 are formed by various deposition processes, such as ALD, CVD, PVD, and/or other suitable process, such as those described herein.

A CMP process can be performed to remove any excess material of gate dielectric layer 284, work function layer 286, and metal fill layer 282, planarizing metal gate structures 285.

Referring to FIGS. 1 and 13A-13C, at operation 160, a top portion of metal gate stacks 280 is removed to prepare device 200 for further processes (for example, forming of self-aligned gate contacts). Removing of metal gate stacks 280 may comprises various processes. In some embodiments, metal gate stacks 280 are selected removed by etching process including a dry etching process, a wet etching process, other proper etching process, or combinations thereof.

Referring to FIG. 1, at operation 165, device 200 can undergo further processing. In some embodiments, a multilayer interconnection (MLI) structure may be formed on substrate 202 to connect various FETs and other devices into a circuit. The MLI structure including contacts, vias and metal lines may be formed through a suitable process. For example, the MLI structure includes gate contacts formed on top of gate stacks 280 by a self-aligned process. In the copper interconnection, the conductive features include copper and may further include a barrier layer. The copper interconnect structure is formed by a damascene process. A damascene process includes depositing an ILD layer; patterning the ILD layer to form trenches; depositing various materials (such as a barrier layer and copper); and performing a CMP process. A damascene process may be a single damascene process or a dual damascene process. The deposition of the copper may include PVD to form a seed layer and plating to form bulk copper on the copper seed layer.

Other metals, such as ruthenium, cobalt, tungsten or aluminum, may be used to form the interconnection structure. In some embodiments, prior to filling conductive material in contact holes, silicide may be formed on the source/drain regions to further reduce the contact resistance. The silicide includes silicon and metal, such as titanium silicide, tantalum silicide, nickel silicide or cobalt silicide. The silicide may be formed by a process referred to as self-aligned silicide (or salicide). The process includes metal deposition, annealing to react the metal with silicon, and etching to remove unreacted metal. In some other embodiments, some other metal, such as ruthenium or cobalt, may be used for contacts and/or vias.

Although not intended to be limiting, one or more embodiments of the present disclosure provide many benefits to a semiconductor device and a formation process thereof. For example, embodiments of the present disclosure form semiconductor device comprising fin top hard mask. The fin top hard mask can protect the fins from being damaged in the following fabricating processes, for example, fin sidewalls pullback process and dummy gate removing process. Thus, the performance of the semiconductor device with fin top hard mask is improved. The present disclosure provides for many different implementations. Semiconductor device having fin top hard mask and methods of fabrication thereof are disclosed herein. An exemplary semiconductor structure includes a semiconductor fin disposed over a substrate, wherein the semiconductor fin includes a channel region and a source/drain region; a gate structure disposed over the channel region of the semiconductor fin, wherein the gate structure includes a gate spacer and a gate stack; and a source/drain structure disposed over the source/drain region of the semiconductor fin. The semiconductor device further includes a fin top hard mask vertically interposed between the gate spacer and the semiconductor fin, wherein the fin top hard mask includes a dielectric layer, and wherein a sidewall of the fin top hard mask directly contacts the gate stack, and another sidewall of the fin top hard mask directly contacts the source/drain structure.

In some implementations, the gate stack of the exemplary semiconductor structure is disposed in a trench defined by a sidewall of the gate spacer, a sidewall of the fin top hard mask, and a top surface of the semiconductor fin in the channel region.

In some implementations, the material of the fin top hard mask having a different etching resistivity than a material of the gate spacer.

In some implementations, the gate spacer includes a first layer of silicon carbon nitride (SiCN) and a second layer of silicon nitride (SiN), the fin top hard mask includes a layer of SiCN, and a concentration of carbon (C) in SiCN in the fin top hard mask is different from a concentration of C in SiCN in the first layer of the gate spacer. In some other embodiments, the fin top hard mask includes a layer of silicon carbon oxynitride (SiCON).

In some implementations, a width of the fin top hard mask is equal to a width of the gate spacer.

In some implementations, the fin top hard mask includes edges aligned with edges of the gate spacer.

In some implementations, a ratio of a thickness of the fin top hard mask to a height of the semiconductor fin is about 5% to about 10%.

Another exemplary semiconductor structure includes a semiconductor fin disposed over a substrate; a gate structure disposed over the substrate and over the semiconductor fin, wherein the gate structure includes a gate stack and a spacer disposed along a sidewall of the gate stack, wherein the gate structure is disposed on the semiconductor fin and defines a channel region underlying the gate stack and a source/drain region not covered by the gate stack. The another exemplary semiconductor structure also includes a fin top hard mask disposed below the spacer and above the semiconductor fin, wherein the fin top hard mask comprises a dielectric material, and a width of the fin top hard mask is equal to a width of the spacer; and a cladding source/drain structure disposed over the source/drain region of the semiconductor fin, wherein the cladding source/drain structure and the gate stack contact sidewalls of the fin top hard mask.

In some implementations, the fin top hard mask is free from a sidewall of the semiconductor fin and edges of the fin top hard mask are aligned with edges of the spacer.

In some implementations, the cladding source/drain structure comprises an epitaxial source/drain feature cladding the source/drain region of the semiconductor fin and a silicide layer surrounding the epitaxial source/drain feature.

An exemplary method includes forming a hard mask over a substrate; forming a fin over the substrate, wherein the fin includes a channel region and a source/drain region, wherein the hard mask is over a top surface of the fin and includes a material having different etching selectivity than a material of the fin; forming a dummy gate stack above the hard mask over the channel region of the fin; forming a spacer layer conformally over the dummy gate stack, over the hard mask, and over the fin; anisotropically removing the spacer layer along sidewalls of the fin; removing the hard mask in the source/drain region of the fin; epitaxially growing a source/drain structure in the source/drain region of the fin; removing the dummy gate stack to form a gate trench exposing the hard mask over the channel region of the fin; removing the hard mask from the gate trench to expose the fin; and forming a metal gate stack over the fin in the gate trench.

In some implementations, the forming a hard mask over a substrate includes forming a dielectric layer over the substrate, the dielectric layer including silicon carbon nitride (SiCN) which is different from a material of the spacer layer.

In some implementations, the forming a hard mask over a substrate further includes forming an amorphous silicon layer over the dielectric layer.

In some implementations, the forming a hard mask over a substrate includes forming the hard mask over the substrate for a thickness about 3.5 nanometers (nm) to about 4 nm.

In some implementations, forming a metal gate stack includes forming a dielectric layer in the gate trench over the hard mask; forming a work function layer in the gate trench over the dielectric layer; and forming a metal fill layer in the gate trench over the work function layer.

In some implementations, the method further includes planarizing a top surface of the metal gate stack; and etching a top portion of the metal gate stack.

In some implementations, the removing of the hard mask in the source/drain region of the fin includes performing a selective dry etching process using the dummy gate structure as an etch mask.

In some implementations, the selective dry etching process is an anisotropic dry etching, and an etchant is fluorine (F) based gas, bromine (Br) based gas, chlorine (Cl) based gas, helium (He), Argon (Ar), or a combination thereof.

In some implementations, the selective dry etching process is an isotropic dry etching, and an etchant is phosphoric acid ($H_3PO_4$).

In some implementations, removing the hard mask from the gate trench to expose the fin includes performing a selective etching process using the spacers as etch masks.

The foregoing outlines features of several implementations so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the implementations introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    forming a hard mask over a substrate;
    forming a fin over the substrate, wherein the fin includes a channel region and a source/drain region, wherein the hard mask is over a top surface of the fin and includes a material having different etching selectivity than a material of the fin;
    forming a dummy gate stack above the hard mask that is disposed over the channel region of the fin;
    forming a spacer layer over the hard mask and the fin;
    removing the spacer layer from along sidewalls of the fin;
    removing the hard mask in the source/drain region of the fin;
    epitaxially growing a source/drain structure on the source/drain region of the fin;
    removing the dummy gate stack to form a gate trench exposing the hard mask disposed over the channel region of the fin;
    removing the hard mask from the gate trench to expose the fin; and
    forming a metal gate stack in the gate trench.

2. The method of claim 1, wherein the forming of the hard mask over the substrate includes forming a dielectric layer over the substrate, the dielectric layer including silicon carbon nitride (SiCN).

3. The method of claim 2, wherein the forming of the hard mask over the substrate further includes forming an amorphous silicon layer over the dielectric layer.

4. The method of claim 1, wherein the forming of the hard mask over the substrate includes forming the hard mask over the substrate with a thickness ranging from about 3.5 nm to about 4 nm.

5. The method of claim 1, wherein the forming of the metal gate stack includes:
    forming a dielectric layer in the gate trench;
    forming a work function layer in the gate trench over the dielectric layer; and
    forming a metal fill layer in the gate trench over the work function layer.

6. The method of claim 5, further comprising:
    planarizing a top surface of the metal gate stack; and
    etching a top portion of the metal gate stack.

7. The method of claim 1, wherein the removing of the hard mask in the source/drain region of the fin includes performing a selective dry etching process while using the dummy gate stack as an etch mask.

8. The method of claim 7, wherein the selective dry etching process is an anisotropic dry etching process that using an etchant that includes a material selected from a group consisting of fluorine, bromine, chlorine, helium and argon.

9. The method of claim 7, wherein the selective dry etching process is an isotropic dry etching process and includes an etchant of phosphoric acid.

10. The method of claim 1, wherein removing the of the hard mask from the gate trench to expose the fin includes performing a selective etching process using the spacers as an etch mask.

11. A method comprising:
    forming a fin structure over a substrate, wherein the fin structure has a top surface covered by a hard mask;
    forming a first gate structure on the hard mask;
    forming a sidewall spacer on the first gate structure;
    removing a portion of the sidewall spacer to expose a first portion of the hard mask;
    removing the first portion of the hard mask to expose a first portion of the top surface of the fin structure;
    forming a source/drain feature on the exposed first portion of the top surface of the fin structure;
    removing the first gate structure to expose a second portion of the hard mask;
    removing the second portion of the hard mask to expose a second portion of the top surface of the fin structure; and
    forming a second gate structure on the exposed second portion of the top surface of the fin structure.

12. The method of claim 11, wherein the forming of the sidewall spacer on the first gate structure includes forming a portion of the sidewall spacer directly on a third portion of the hard mask, and
    wherein the forming of the second gate structure on the exposed second portion of the top surface of the fin structure includes forming a gate dielectric layer directly on the third portion of the hard mask.

13. The method of claim 11, further comprising forming a dielectric isolation structure directly on the fin structure and the hard mask.

14. The method of claim 11, wherein the forming of the fin structure over the substrate includes:
    forming one or more semiconductor material layers over the substrate;
    forming the hard mask over the one or more semiconductor material layers; and
    patterning the hard mask and the one or more semiconductor material layers to form the fin structure having the hard mask covering the top surface of the fin structure.

15. The method of claim 14, wherein opposing side surface of the fin structure are exposed after the patterning of the hard mask and the one or more semiconductor material layers to form the fin structure having the hard mask covering the top surface of the fin structure.

16. The method of claim 11, wherein the hard mask includes a first material layer having a first concentration of carbon, and wherein the sidewall spacer includes a second material having a second concentration of carbon that is different from first concentration of carbon in the first material layer.

17. A method comprising:
    forming one or more semiconductor material layers over a substrate;
    forming a high-k dielectric layer on the one or more semiconductor material layers;
    patterning the high-k dielectric layer and the one or more semiconductor material layers to form a fin structure with the patterned high-k dielectric layer covering a top surface of the fin structure;

forming an interlevel dielectric layer over the fin structure;

forming a trench through the interlevel dielectric layer, wherein a first portion of the patterned high-k dielectric layer is exposed within the trench;

removing the first portion of the patterned high-k dielectric layer to expose a first portion of the top surface of the fin structure;

forming a gate dielectric layer on the first portion of the top surface of the fin structure, wherein the gate dielectric layer interfaces with a second portion of the patterned high-k dielectric layer; and forming a gate electrode layer on the gate dielectric layer.

18. The method of claim 17, further comprising:

removing a third portion of the patterned high-k dielectric layer to expose a second portion of the top surface of the fin structure; and forming a source/drain feature on the exposed second portion of the top surface of the fin structure.

19. The method of claim 17, wherein the high-k dielectric layer includes a material selected from a group consisting of silicon carbon nitride (SiCN) and silicon carbon oxynitride (SiCON).

20. The method of claim 17, wherein the forming the high-k dielectric layer on the one or more semiconductor material layers includes forming an amorphous silicon layer on the one or more semiconductor material layers.

* * * * *